United States Patent
Han et al.

(10) Patent No.: US 11,244,985 B2
(45) Date of Patent: Feb. 8, 2022

(54) COLOR FILM ASSEMBLY, DISPLAY SUBSTRATE AND METHOD FOR FABRICATING SAME, AND DISPLAY APPARATUS

(71) Applicant: BOE Technology Group Co., Ltd., Beijing (CN)

(72) Inventors: Jiahui Han, Beijing (CN); Zheng Fang, Beijing (CN); Ming Zhu, Beijing (CN); Ge Shi, Beijing (CN); Haijun Niu, Beijing (CN); Shiyu Zhang, Beijing (CN); Yujie Liu, Beijing (CN); Song Yang, Beijing (CN); Yuyao Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 258 days.

(21) Appl. No.: 16/684,676

(22) Filed: Nov. 15, 2019

(65) Prior Publication Data

US 2020/0219936 A1 Jul. 9, 2020

(30) Foreign Application Priority Data

Jan. 3, 2019 (CN) .......................... 201910005162.7

(51) Int. Cl.
*H01L 27/32* (2006.01)
*H01L 51/50* (2006.01)

(52) U.S. Cl.
CPC .......... *H01L 27/322* (2013.01); *H01L 27/326* (2013.01); *H01L 27/3232* (2013.01); *H01L 51/502* (2013.01)

(58) Field of Classification Search
CPC .. H01L 27/326; H01L 27/3232; H01L 27/322
See application file for complete search history.

(56) References Cited

U.S. PATENT DOCUMENTS

2014/0192294 A1* 7/2014 Chen ................. G02F 1/133514
349/69
2016/0003448 A1 1/2016 Dong et al.
(Continued)

FOREIGN PATENT DOCUMENTS

CN 103454808 A 12/2013
CN 103472513 A 12/2013
(Continued)

OTHER PUBLICATIONS

First office action of Chinese application No. 201910005162.7 dated Mar. 2, 2021.

*Primary Examiner* — Douglas M Menz
(74) *Attorney, Agent, or Firm* — Fay Sharpe LLP

(57) ABSTRACT

The present disclosure discloses a color film assembly, a display substrate and a method for fabricating the same, and a display apparatus. The color film assembly includes a quantum dot layer, and a filter layer on a light emitting side of the quantum dot layer. The filter layer includes filter units. Each of the filter units includes a first filter structure. A light emitting surface of the first filter structure has at least one converging structure. The quantum dot layer includes quantum dot units which are in one-to-one correspondence with the filter units. Each quantum dot unit includes at least one quantum dot structure. The quantum dot structures in each quantum dot unit are in one-to-one correspondence with the first filter structures in the corresponding filter unit.

20 Claims, 13 Drawing Sheets

(56) References Cited

U.S. PATENT DOCUMENTS

| | | | |
|---|---|---|---|
| 2018/0088266 A1* | 3/2018 | Kim | G02F 1/133615 |
| 2018/0190942 A1* | 7/2018 | Song | G02B 3/0056 |
| 2018/0203281 A1 | 7/2018 | Zhang et al. | |
| 2018/0213209 A1* | 7/2018 | Cui | G02B 30/26 |
| 2018/0233686 A1* | 8/2018 | Tian | G02F 1/133512 |
| 2018/0284534 A1 | 10/2018 | Song et al. | |
| 2019/0278152 A1* | 9/2019 | Wang | G02F 1/133526 |

FOREIGN PATENT DOCUMENTS

| | | |
|---|---|---|
| CN | 104808383 A | 7/2015 |
| CN | 105826249 A | 8/2016 |
| CN | 106707610 A | 5/2017 |

\* cited by examiner

COLOR FILM ASSEMBLY, DISPLAY SUBSTRATE AND METHOD FOR FABRICATING SAME, AND DISPLAY APPARATUS

This application claims priority to Chinese Patent Application No. 201910005162.7, filed on Jan. 3, 2019 and entitled "COLOR FILM ASSEMBLY, DISPLAY SUBSTRATE AND METHOD FOR FABRICATING SAME, AND DISPLAY APPARATUS", the entire contents of which are incorporated herein by reference.

TECHNICAL FIELD

The present disclosure relates to a color film assembly, a display substrate and a method for fabricating the same, and a display apparatus.

BACKGROUND

With the development of the display technology, there have appeared various display apparatuses, and a quantum dot (QD) display apparatus as a novel display apparatus is widely applied in the display field.

SUMMARY

The present disclosure provides a color film assembly, a display substrate and a method for fabricating the same, and a display apparatus. The present disclosure provides the following technical solutions.

In an aspect, a color film assembly is provided. The color film assembly includes:

a quantum dot layer, and a filter layer positioned on a light emitting side of the quantum dot layer; wherein the filter layer includes a plurality of filter units, each of the filter units including at least one first filter structure, a light emitting surface of the first filter structure having at least one converging structure; and the quantum dot layer includes a plurality of quantum dot units in one-to-one correspondence with the plurality of filter units, each of the quantum dot units including at least one quantum dot structure, the quantum dot structures in the quantum dot unit being in one-to-one correspondence with the first filter structures in the corresponding filter unit; and the converging structure is configured to deflect light incident into the converging structure, such that light emitted from the first filter structure converges towards a center of the light emitting surface of the first filter structure.

Optionally, the converging structure is a convex structure, and an included angle between a plane where at least one side of the converging structure is located and a plane where a light incident surface of the first filter structure is located is an acute angle.

Optionally, a cross section of the converging structure in a direction perpendicular to the plane where the light incident surface of the first filter structure is located is triangular or trapezoidal.

Optionally, the first filter structure is a sawtooth structure, and the light emitting surface of the first filter structure is a sawtooth surface.

Optionally, an orthographic projection of the quantum dot structure on a plane where a light incident surface of the quantum dot structure is located coincides with an orthographic projection of the corresponding first filter structure on the plane where the light incident surface of the quantum point structure is located.

Optionally, the filter unit includes two first filter structures, and the quantum dot unit includes two quantum dot structures, wherein colors of light emitted from two quantum dot structures in the quantum dot unit are different.

Optionally, the filter unit further includes a second filter structure, wherein a light emitting surface and a light incident surface of the second filter structure are both planar.

Optionally, the two first filter structures include a red filter structure and a green filter structure, wherein the second filter structure is a blue filter structure; and the two quantum dot structures include a red quantum dot structure corresponding to the red filter structure and a green quantum dot structure corresponding to the green filter structure.

Optionally, the color film assembly further includes:

an organic layer, positioned on a side of the filter layer distal from the quantum dot layer, wherein the organic layer has a refractive index less than that of the filter layer.

Optionally, the color film assembly further includes:

a black matrix pattern, positioned between the filter layer and the quantum dot layer.

Optionally, the filter unit includes two first filter structures, wherein the two first filter structures including a red filter structure and a green filter structure; and the filter unit further includes a blue filter structure, wherein a light emitting surface and a light incident surface of the blue filter structure are both planar;

the quantum dot unit includes two quantum dot structures, wherein the two quantum dot structures include a red quantum dot structure corresponding to the red filter structure, and a green quantum dot structure corresponding to the green filter structure, and an orthographic projection of the quantum dot structure on the plane where a light incident surface of the quantum dot structure is located coincides with an orthographic projection of the corresponding first filter structure on the plane where the light incident surface of the quantum dot structure is located;

the first filter structure is a sawtooth structure, the light emitting surface of the first filter structure is a sawtooth surface, the converging structure is a convex structure, an included angle between a plane where at least one side of the converging structure is located and a plane where the light incident surface of the first filter structure is located is an acute angle, and a cross section of the converging structure in a direction perpendicular to the plane where the light incident surface of the first filter structure is located is triangular or trapezoidal;

the color film assembly further includes an organic layer, positioned on a side of the filter layer distal from the quantum dot layer, wherein the organic layer has a refractive index less than that of the filter layer; and a black matrix pattern, positioned between the filter layer and the quantum dot layer.

In another aspect, a display substrate is provided. The display substrate includes a base substrate, and a color film assembly positioned on the base substrate, wherein the color film assembly includes:

a quantum dot layer, and a filter layer positioned on a light emitting side of the quantum dot layer; wherein the filter layer includes a plurality of filter units, each of the filter units including at least one first filter structure, a light emitting surface of the first filter structure having at least one converging structure; and the quantum dot layer includes a plurality of quantum dot units in one-to-one correspondence with the plurality of filter units, each of the quantum dot units including at least one quantum dot structure, the quantum dot structures in the quantum dot unit being in one-to-one correspondence with the first filter structures in the corresponding filter unit; and the converging structure is configured to deflect light incident into the converging structure, such that light emitted from the first filter structure converges towards a center of the light emitting surface of the first filter structure.

Optionally, the converging structure is a convex structure, and an included angle between the plane where at least one side of the converging structure is located and the plane where the light incident surface of the first filter structure is located is an acute angle.

Optionally, the filter unit includes two first filter structures, and the quantum dot unit includes two quantum dot structures, wherein colors of light emitted from the two quantum dot structures in the quantum dot unit are different; and the filter unit further includes a second filter structure, wherein a light emitting surface and a light incident surface of the second filter structure are both planar.

Optionally, the color film assembly further includes:

an organic layer, positioned on a side of the filter layer distal from the quantum dot layer, wherein the organic layer has a refractive index smaller than that of the filter layer; and a black matrix pattern, positioned between the color filter layer and the quantum dot layer; and the display substrate further includes a flat layer, positioned on a side of the quantum dot layer distal from the base substrate.

In yet another aspect, a method for fabricating a display substrate is provided. The method includes:

providing a base substrate;

forming a color film assembly on the base substrate, wherein the color film assembly includes a filter layer and a quantum dot layer that are are superimposed in a direction distal from the base substrate, the filter layer includes a plurality of filter units, each of the filter units includes at least one first filter structure, a light emitting surface of the first filter structure has at least one converging structure; and the quantum dot layer includes a plurality of quantum dot units in one-to-one correspondence with the plurality of filter units, wherein each of the quantum dot units includes at least one quantum dot structure, and the quantum dot structures in the quantum dot unit are in one-to-one correspondence with the first filter structures in the corresponding filter unit;

the converging structure is configured to deflect light incident into the converging structure, such that light emitted from the first filter structure converges towards the center of the light emitting surface of the first filter structure.

Optionally, the color film assembly further includes an organic layer, the forming a color film assembly on the base substrate includes:

forming the organic layer on the base substrate, wherein one surface of the organic layer distal from the base substrate has a plurality of first recess regions and a plurality of second recess regions, each of the first recess regions having at least one groove, an included angle between a plane where at least one of sides of the groove is located and a surface of the base substrate being an acute angle;

forming the filter layer on the base substrate where the organic layer is formed, wherein the filter layer includes a plurality of the first filter structures and a plurality of second filter structures, the plurality of first filter structures being positioned in the plurality of first recess regions in a one-to-one correspondence fashion, a portion, positioned in the groove, of the first filter structure being the converging structure, the plurality of second filter structures being positioned in the plurality of second recess regions in a one-to-one correspondence fashion, a light emitting surface and a light incident surface of the second filter structure being both planar; and forming the quantum dot layer on the base substrate where the filter layer is formed.

Optionally, the forming a color film assembly on the base substrate further includes:

forming a black matrix pattern on the base substrate where the filter layer is formed;

the forming the quantum dot layer on the base substrate where the filter layer is formed includes:

forming the quantum dot layer on the base substrate where the black matrix pattern is formed; and the method further includes: forming a flat layer on the base substrate where the quantum dot layer is formed.

In still yet another aspect, a display apparatus is provided. The display apparatus includes the display substrate according to the above aspect.

Optionally, the display substrate is a color film substrate, and the display apparatus further includes:

an array substrate, opposite to the display substrate;

a liquid crystal layer, positioned between the array substrate and the display substrate; and a blue backlight module, positioned on a side of the array substrate distal from the display substrate.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

Accompanying drawings here are incorporated into the description and constitute a part of the description, illustrate embodiments consistent with the present disclosure, and are used to describe the principle of the present disclosure together with the description.

DETAILED DESCRIPTION

For clearer description of the principles, technical solutions and advantages in the embodiments of the present disclosure, the present disclosure is hereinafter described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

A quantum dot display apparatus, as a novel display apparatus, is widely applied in the display field. The quantum dot display apparatus emits light through quantum dots. Quantum dots (also known as nanocrystals) are nanoparticles composed of II-VI elements or III-V elements. When exposed to light, the quantum dots enter an excited state from a ground state and emit light with a specific wavelength (i.e., a specific color) when falling back from the excited state to the ground state.

Figure 1:
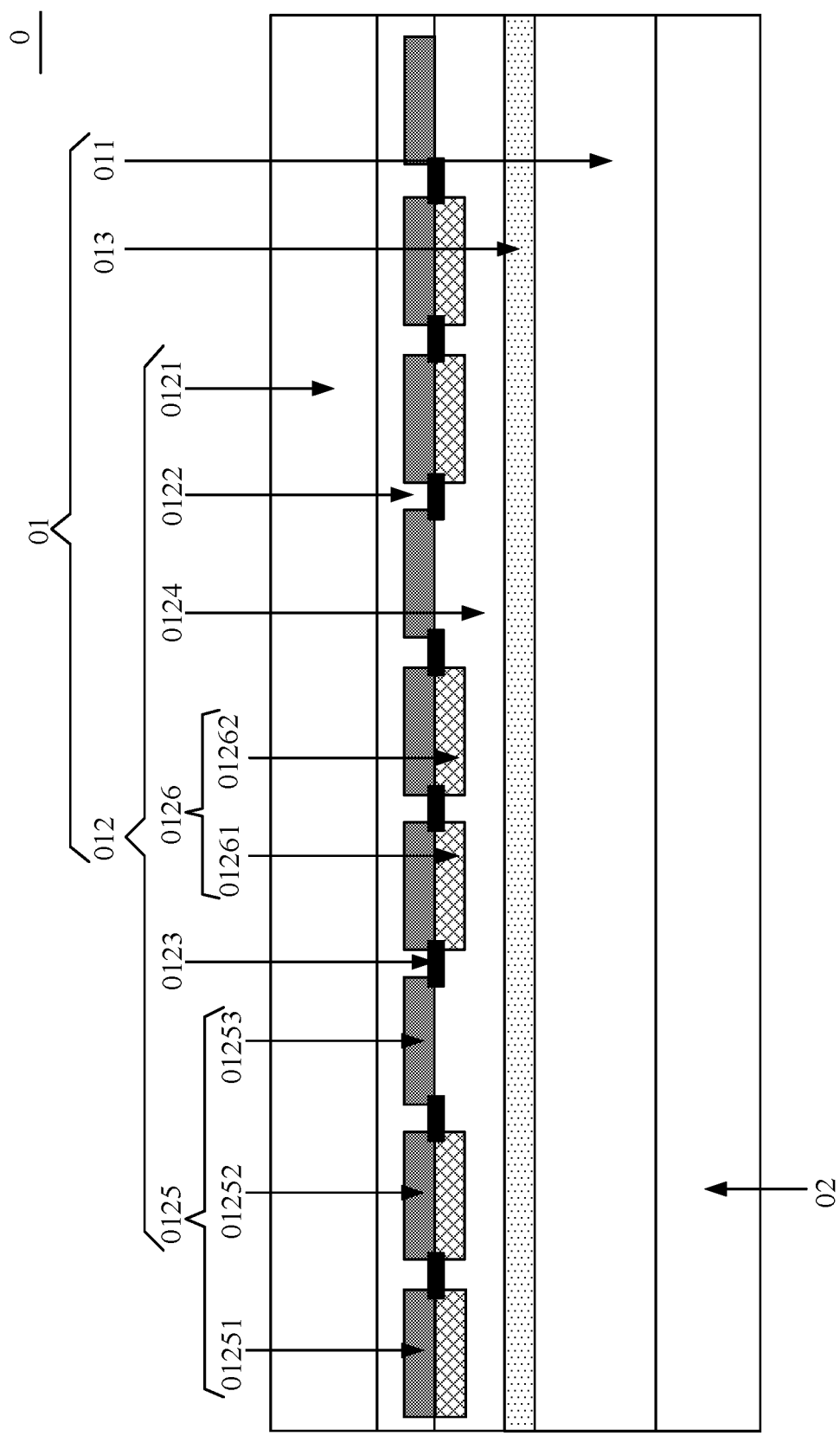
FIG. 1 is a schematic structural diagram of a quantum dot display apparatus according to an embodiment of the present disclosure.

Referring to FIG. 1, a schematic structural diagram of a quantum dot display apparatus 0 according to an embodiment of the present disclosure is illustrated. The quantum dot display apparatus 0 includes a quantum dot display panel 01 and a backlight module 02. The quantum dot display panel 01 includes an array substrate 011 and a color filter substrate 012 which are opposite, and a liquid crystal layer 013 between the array substrate 011 and the color filter substrate 012. The backlight module 02 is positioned on a side of the quantum dot display panel 01 near the array substrate 011. The backlight module 02 is a blue backlight module. The color film substrate 012 includes a base substrate 0121; an organic layer 0122, a filter layer (not shown in FIG. 1), a black matrix pattern 0123, a quantum dot layer (not shown in FIG. 1) and a flat layer 0124 which are sequentially disposed on the base substrate 0121. The filter layer includes a plurality of filter units 0125 (three filter units are shown in FIG. 1 and only one filter unit is indicated). Each filter unit 0125 includes a red filter structure 01251, a green filter structure 01252 and a blue filter structure 01253. The quantum dot layer includes a plurality of quantum dot units 0126 that are in one-to-one correspondence with the plurality of filter units 0125 (three filter units are shown in FIG. 1 and only one filter unit is indicated). Each quantum dot unit 0126 includes a red quantum dot structure 01261 and a green quantum dot structure 01262, wherein the red quantum dot structure 01261 in each quantum dot unit 0126 corresponds to a red filter structure 01251 in the corresponding filter unit 0125, and the green quantum dot structure 01262 in each quantum dot unit 0126 corresponds to the green filter structure 01252 in the corresponding filter unit 0125. When the quantum dot display apparatus 0 is displayed, blue light emitted from the backlight module 02 sequentially passes through the array substrate 011, the liquid crystal layer 013, and the flat layer 0124 to enter the quantum dot layer. When the blue light passes through the red quantum dot structure 01261, the red quantum dot structure 01261 is excited to emit red light. When the blue light passes through the green quantum dot structure 01262, the green quantum dot structure 01262 is excited to emit green light. The light which does not pass through the quantum dot structure is blue light. The red light passes through the red filter structure 01251, the organic layer 0122 and the base substrate 0121 to be emitted from the quantum dot display panel 01. The green light sequentially passes through the green filter structure 01252, the organic layer 0122 and the base substrate 0121 to be emitted from the quantum dot display panel 01. The blue light sequentially passes through the blue filter structure 01253, the organic layer 0122 and the base substrate 0121 to be emitted from the quantum dot display panel 01.

Figure 2:
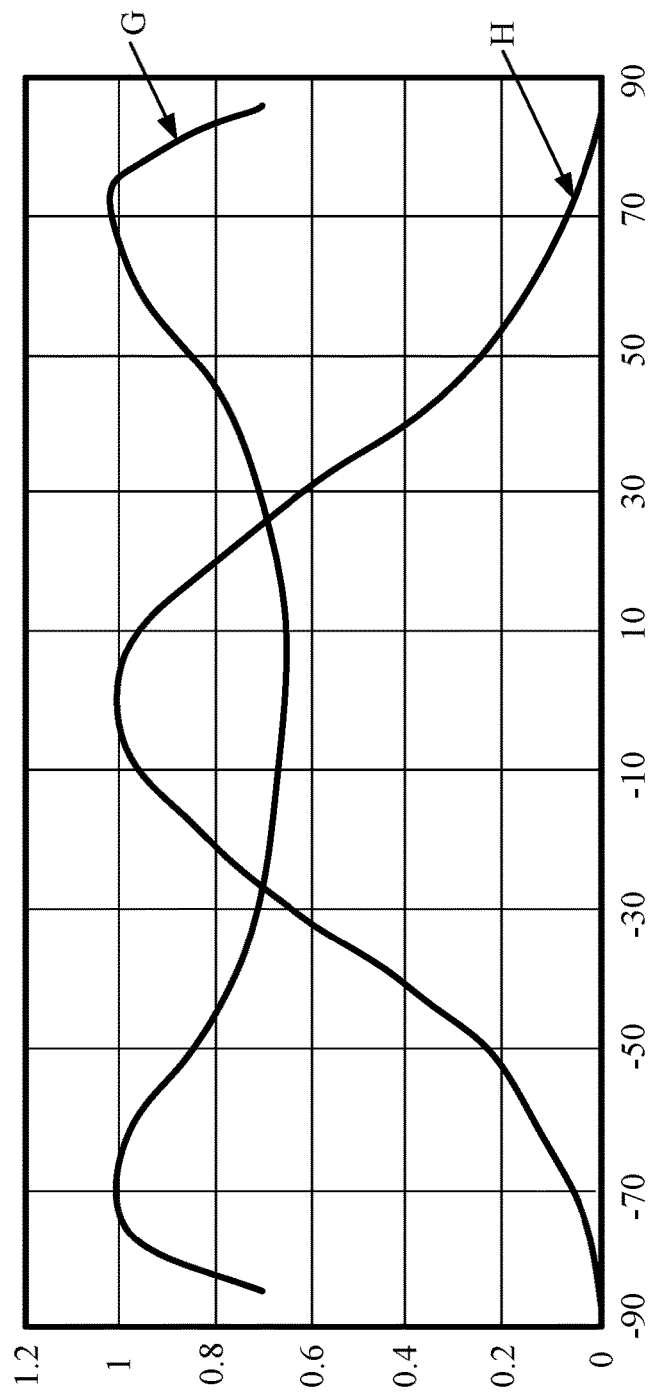
FIG. 2 is a schematic diagram of luminance distribution of light emitted from a quantum dot display apparatus shown in FIG. 1.

In the light emitted from the quantum dot structure, the length of a propagation path of front-viewing light (light perpendicular to a light emitting surface of the quantum dot structure) in the quantum dot structure is smaller than that of a propagation path of side-viewing light (light where an included angle between it and the light emitting surface of the quantum dot structure is an acute angle) in the quantum dot structure, accordingly, the quantity of quantum dots through which the front-viewing light passes is smaller than that of quantum dots through which the side-viewing light passes, such that the luminance of the front-viewing light emitted from the quantum dot display apparatus through the quantum dot structure is less than that of the side-viewing light, and the luminance of the front-viewing light emitted from the quantum dot display apparatus without passing through the quantum dot structure is greater than that of the side-viewing light, resulting in the color shift of the quantum dot display apparatus. Exemplarily, reference is made to FIG. 2, which shows a schematic diagram of luminance distribution of light emitted from the quantum dot display apparatus 0 shown in FIG. 1, wherein a horizontal ordinate represents an included angle between the light emitted from the quantum dot display apparatus 0 and a plane perpendicular to the light emitting surface of the quantum dot display apparatus 0, a vertical coordinate represents luminance of the light emitted from the quantum dot display apparatus 0, a curve G represents a luminance curve of light emitted from the quantum dot display apparatus 0 sequentially through the quantum dot structure and the filter structure, and a curve H represents a luminance curve of light emitted from the quantum dot display apparatus 0 through the filter structure and without passing through the quantum dot structure. As seen from FIG. 2, a difference between a trend of the curve G and a trend of the curve H is large. That is, a difference between the luminance distribution of the light emitted from the quantum dot display apparatus 0 through the quantum dot structure and the luminance distribution of the light emitted from the quantum dot display apparatus 0 without passing through the quantum dot structure is large. Therefore, the quantum dot display apparatus 0 has the color shift.

The present disclosure provides a color film assembly, a display substrate and a method for fabricating the same, and a display apparatus. In the color film assembly, a light emitting surface of the first filter structure has a converging structure. The converging structure may deflect light incident into the converging structure through the quantum dot structure, such that the light emitted from the first filter structure converges towards the center of the light emitting surface of the first filter structure, the luminance of the front-viewing light emitted from the color film assembly through the quantum dot structure is increased, the difference between the luminance distribution of the light emitted from the color film assembly through the quantum dot structure and the luminance distribution of the light emitted from the color film assembly without passing through the quantum dot structure is reduced, the color shift of the color film assembly and the display substrate is favorably decreased, the color shift of the display apparatus is reduced, and the display effect of the display apparatus is improved. For detailed descriptions of the solution according to the present disclosure, reference may be made to the following embodiments.

Figure 3:
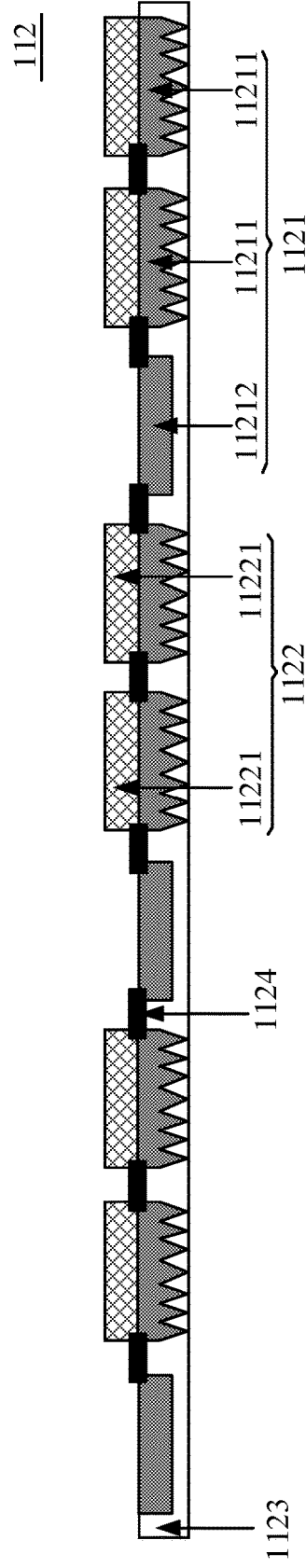
FIG. 3 is a schematic structural diagram of a color film assembly according to an embodiment of the present disclosure.
Figure 4:
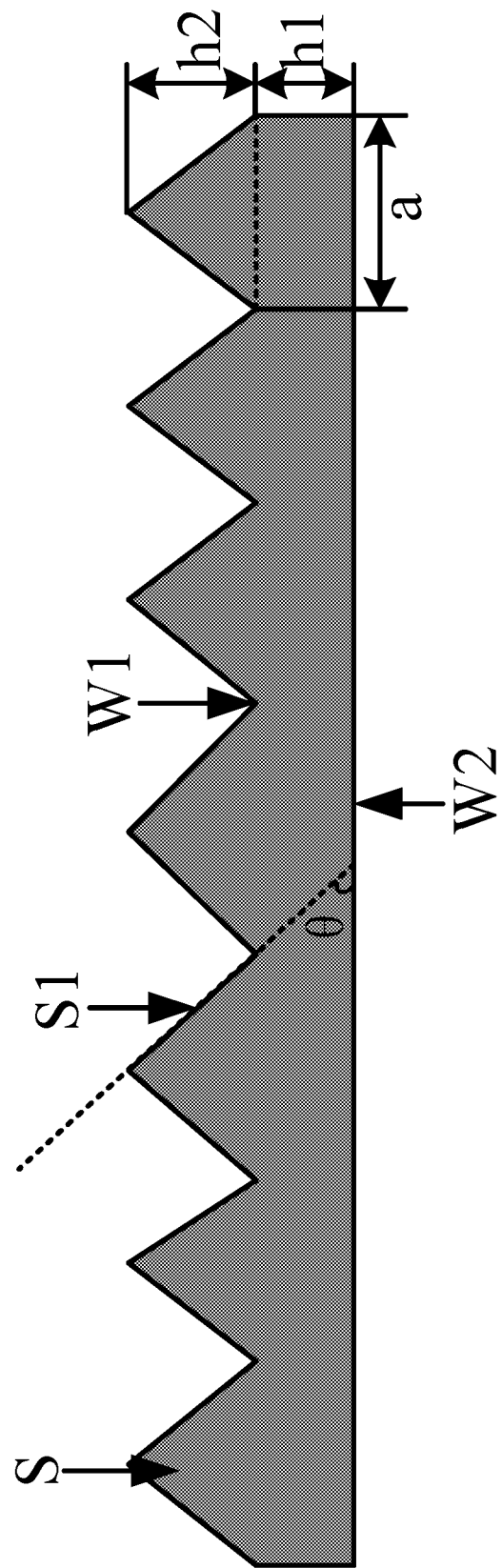
FIG. 4 is a schematic cross-sectional view of a filter structure according to an embodiment of the present disclosure.

Referring to FIG. 3, a schematic structural diagram of a color film assembly 112 according to an embodiment of the present disclosure is illustrated. The color film assembly 112 includes a quantum dot layer (not shown in FIG. 3) and a filter layer (not shown in FIG. 3) positioned on a light emitting side of the quantum dot layer. The filter layer includes a plurality of filter units 1121, and each filter unit 1121 includes at least one first filter structure 11211. Reference is made to FIG. 4, which shows a schematic diagram showing a structure of a first filter structure 11211 according to an embodiment of the present disclosure. With reference to FIG. 3 and FIG. 4, each first filter structure 11211 has a light emitting surface W1 and a light incident surface W2 which are opposite. The light emitting surface W1 of each first filter structure 11211 has at least one converging structure S. As shown in FIG. 3, the quantum dot layer includes a plurality of quantum dot units 1122 in one-to-one correspondence with the plurality of filter units 1121. Each quantum dot unit 1122 includes at least one quantum dot structure 11221. The quantum dot structures 11221 in each quantum dot unit 1122 are in one-to-one correspondence with the first filter structures 11211 in the corresponding filter unit 1121.

Each quantum dot structure 11221 is configured to emit colored light with a target color under the excitation of light incident into the quantum dot structure 11221, wherein the target color is different from a color of the light incident into the quantum dot structure 11221. Each first filter structure 11211 is configured to filter the light incident into the first filter structure 11211. Each converging structure S is configured to deflect light incident into the converging structure S, such that the light emitted from the first filter structure 11211 to which the converging structure S belongs converges towards a center of the light emitting surface of the first filter structure 11211.

In summary, in the color film assembly according to the embodiment of the present disclosure, the light emitting surface of the first filter structure has the converging structure. The converging structure may deflect the light incident into the converging structure through the quantum dot structure, such that the light emitted from the first filter structure converges towards the center of the light emitting surface of the first filter structure, the luminance of the front-viewing light emitted from the color film assembly through the quantum dot structure is increased, the difference between the luminance distribution of the light emitted from the color film assembly through the quantum dot structure and the luminance distribution of the light emitted from the color film assembly without passing through the quantum dot structure is reduced, the color shift of the color film assembly is favorably decreased, the color shift of the display apparatus is reduced, and the display effect of the display apparatus is improved.

Figure 5:
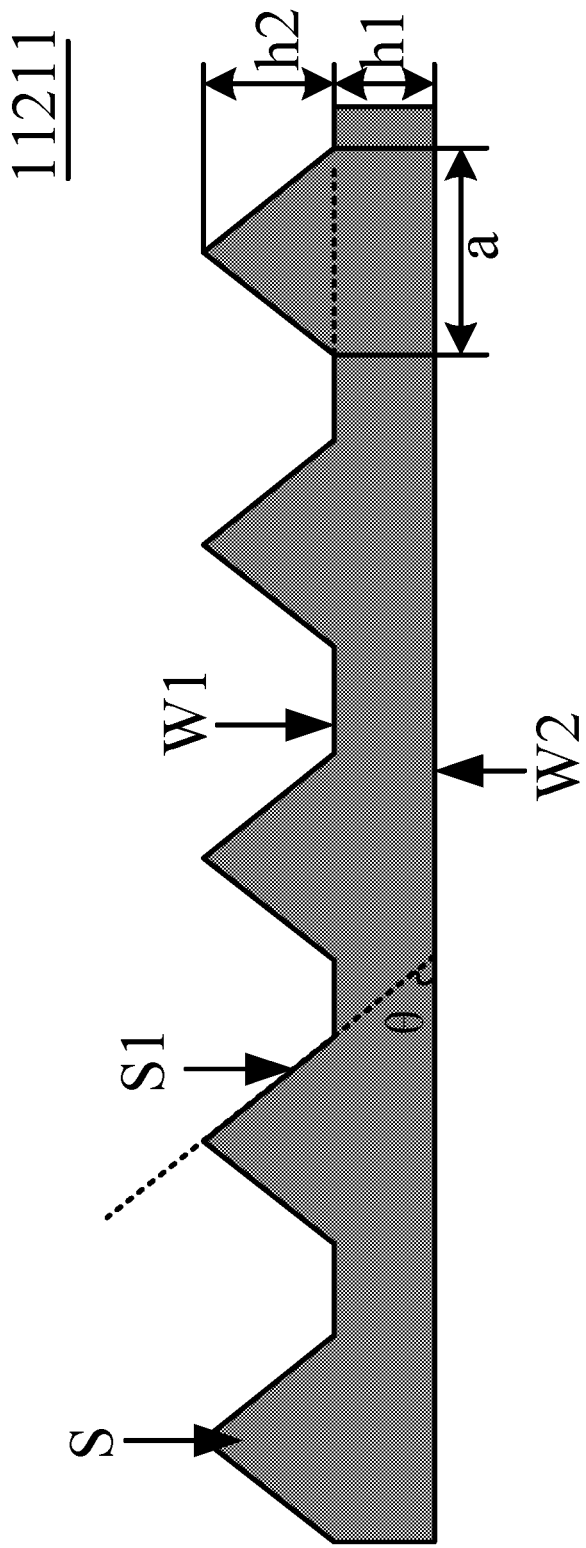
FIG. 5 is a schematic cross-sectional view of another filter structure according to an embodiment of the present disclosure.
Figure 6:
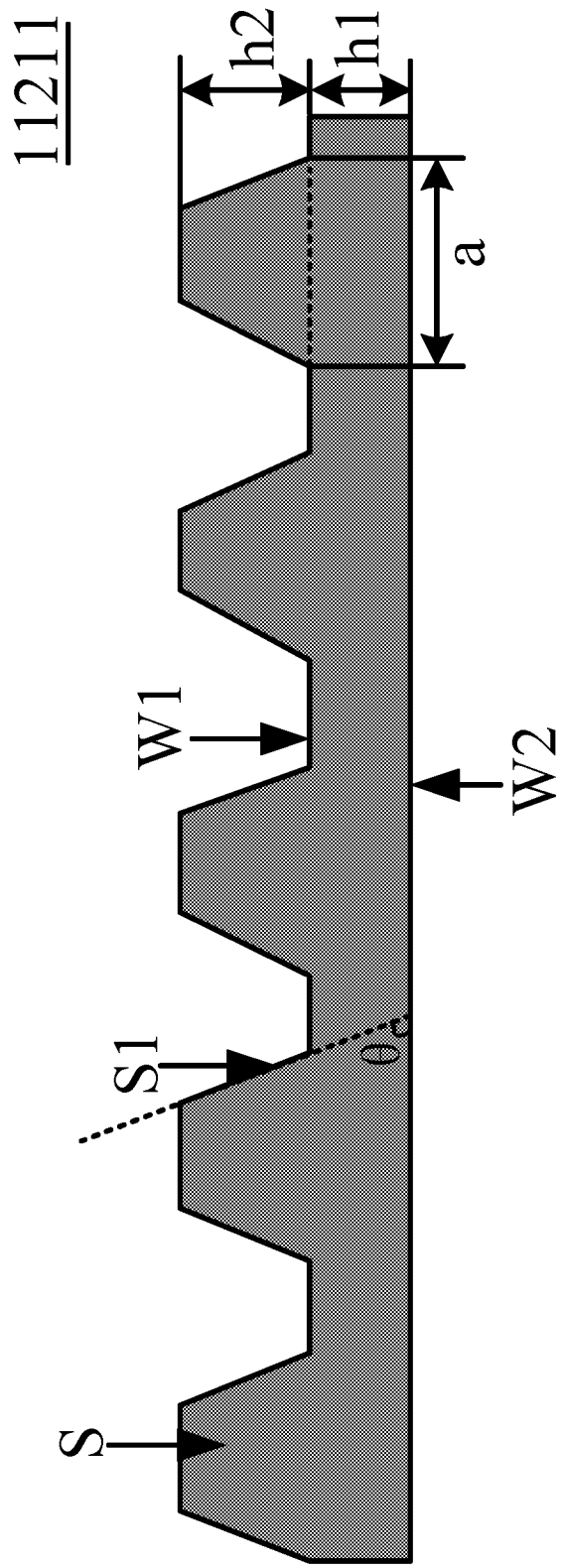
FIG. 6 is a schematic cross-sectional view of still another filter structure according to an embodiment of the present disclosure.

Optionally, referring to FIG. 5 and FIG. 6, schematic structural diagrams of two other first filter structures 11211 according to an embodiment of the present disclosure are illustrated. With reference to FIG. 4 to FIG. 6, each converging structure S is a convex structure, and each converging structure S may be a pyramid-shaped convex structure. When the light emitting surface W1 of the first filter structure 11211 has a plurality of converging structures S, the plurality of converging structures S may be arranged in an array to form a pyramid array. Optionally, an included angle between a plane (not indicated in FIG. 4 to FIG. 6) where at least one side of each converging structure S is located and a plane (not shown in FIG. 4 to FIG. 6) where the light incident surface W2 of the first filter structure 11211 is located is an acute angle. For example, as shown in FIG. 4 to FIG. 6, an included angle θ between a plane where a side Si of each converging structure S is located and a plane (not indicated in FIG. 4 to FIG. 6) where the light incident surface W2 of the first filter structure 11211 is located is an acute angle. Optionally, each converging structure S has two sides, and an included angle between a plane where each side of each converging structure S is located and the plane where the light incident surface W2 of the first filter structure 11211 is located is an acute angle. The value of the included angle θ may be determined according to actual needs, which is not limited in the embodiment of the present disclosure. Optionally, the first filter structure 11211 is a sawtooth structure, the light emitting surface W1 of the first filter structure 11211 is a sawtooth surface, and the light incident surface W2 is a plane. Certainly, the light emitting surface of the first filter structure may be set as a plane, and the light incident surface may be set as a sawtooth surface, which are not limited in the embodiment of the present disclosure.

Optionally, as shown in FIG. 4 and FIG. 5, a cross section of each converging structure S in a direction perpendicular to the light incident surface W2 of the first filter structure 11211 is triangular, wherein one side of the triangle may be parallel to the light incident surface W2 of the first filter structure 11211. Certainly, sides of the triangle may not be parallel to the light incident surface W2 of the first filter structure 11211; or as shown in FIG. 6, a cross section of each converging structure S in the direction perpendicular to the light incident surface W2 of the first filter structure 11211 is trapezoidal, wherein a bottom side of the trapezoid may be parallel to the light incident surface W2 of the first filter structure 11211. Certainly, sides of the trapezoid may not be parallel to the light incident surface W2 of the first filter structure 11211. As shown in FIG. 4 to FIG. 6, the width of each converging structure S is a, the distance between the bottom surface of each converging structure S and the light incident surface W2 of the first filter structure 11211 is h1, the height of each converging structure S is h2, and values of a, h1 and h2 may be determined as needed. For example, a=1 um (micrometer), h1=0.5 um, and h2=1.6 um, which are not limited in the embodiment of the present disclosure.

Figure 7:
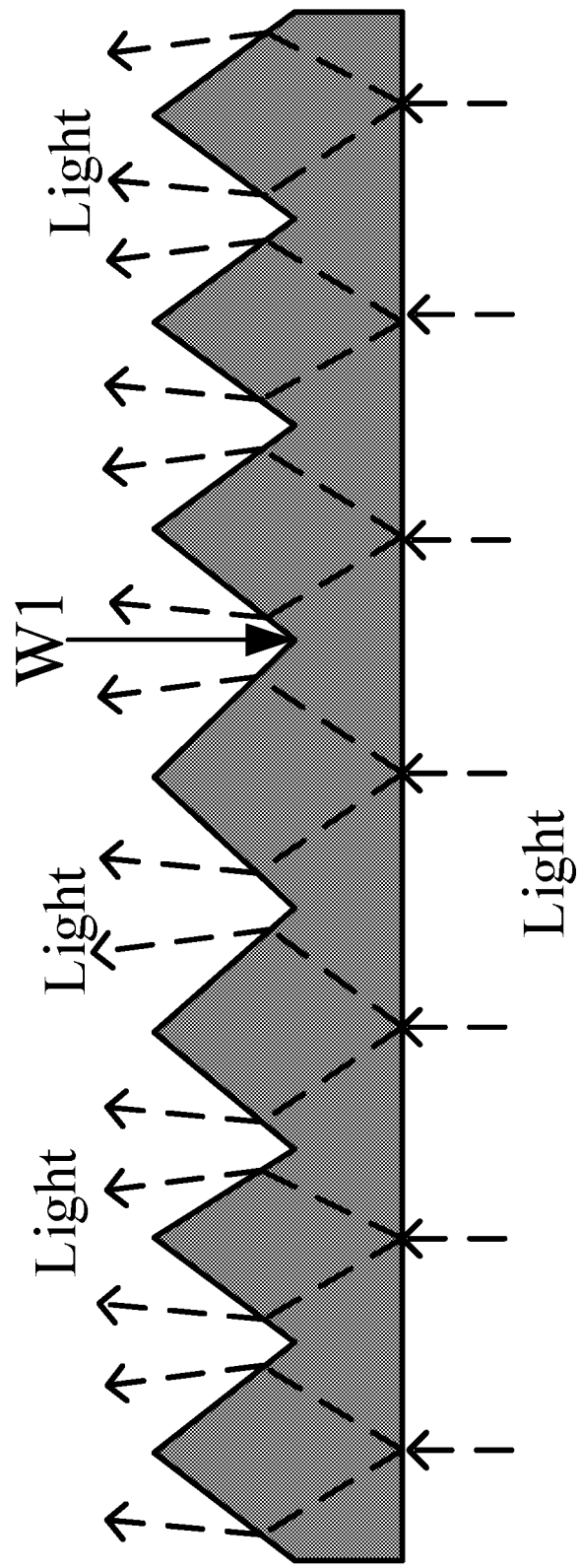
FIG. 7 is a schematic diagram of a propagation path of light in a filter structure shown in FIG. 4.

It should be readily understood for those skilled in the art that the first filter structure 11211 according to the embodiment of the present disclosure may filter not only the light, but also deflect light incident into the first filter structure 11211 through the light incident surface W2 and emitted from the first filter structure 11211 through the light emitting surface W1, such that the light emitted from the first filter structure 11211 converges towards the center of the light emitting surface W1 of the first filter structure 11211 (that is, the light emitted from the light emitting surface W1 of the first filter structure 11211 contracts towards the center of the light emitting surface W1), such that the luminance of the front-viewing light emitted from the first filter structure 11211 is increased. Exemplarily, with reference to FIG. 7, which shows a schematic diagram of a propagation path of light in a first filter structure 11211 shown in FIG. 4, when the light is emitted from the converging structure S (not shown in FIG. 7), because the light is deflected due to refraction on the side of the converging structure S, it may be known from the refraction law that when the medium in contact with the light emitting surface W1 of the first filter structure 11211 has a refractive index smaller than that of the first filter structure 11211, the incident angle of the light incident into the side of the converging structure S is smaller than a refraction angle, such that the light emitted from the light emitting surface W1 of the first filter structure 11211 converges towards the center of the light emitting surface W1 of the first filter structure 11211. It should be readily understood that the three first filter structures shown in FIG. 4 to FIG. 6 are merely exemplary, and the first filter structure may have other structures, as long as it is ensured that the light can be deflected to enable the light emitted from the first filter structure to converge towards the center of the light emitting surface of the first filter structure, which is not limited in the embodiment of the present disclosure.

Optionally, in the embodiment of the present disclosure, an orthographic projection of each quantum dot structure 11221 on the plane where the light incident surface of the quantum dot structure 11221 is located at least partially overlaps with an orthographic projection on the plane where the light incident surface of the quantum dot structure 11221 is located. Optionally, as shown in FIG. 3, an orthographic projection of each quantum dot structure 11221 on the plane where the light incident surface (not shown in FIG. 3) of the quantum dot structure 11221 is located coincides with an orthographic projection of the corresponding first filter structure 11211 on the plane where the light incident surface of the quantum dot structure 11221 is located.

Optionally, as shown in FIG. 3, each filter unit 1121 includes two first filter structures 11211. Each quantum dot unit 1122 includes two quantum dot structures 11221. Colors of light emitted from the two quantum dot structures 11221 in each quantum dot unit 1122 are different. Each filter unit 1121 further includes a second filter structure 11212. A light emitting surface and a light incident surface of the second filter structure 11212 are both planar. Exemplarily, in each filter unit 1121, the two first filter structures 11211 include a red filter structure and a green filter structure, wherein the second filter structure 11212 is a blue filter structure. In each quantum dot unit 1122, the two quantum dot structures 11221 include a red quantum dot structure and a green quantum dot structure, wherein the red quantum dot structure corresponds to the red filter structure, and the green quantum dot structure corresponds to the green filter structure. Light incident into each quantum dot structure 11221 may be blue light. The red quantum dot structure is configured to emit red light under the excitation of the blue light incident into the red quantum dot structure. The red light is incident into the corresponding red filter structure after being emitted from the red quantum dot structure. The red filter structure is configured to filter red light incident into the red filter structure. The green quantum dot structure is configured to emit green light under the excitation of blue light incident into the green quantum dot structure. The green light is incident into the corresponding green filter structure after being emitted from the green quantum dot structure. The green filter structure is configured to filter the green light incident into the green filter structure. It should be readily understood for those skilled in the art that in practical applications, the red light incident into the corresponding red filter structure through the red quantum dot structure may be mixed with blue light for exciting the red quantum dot structure to emit light, and the red filter structure may be used for filtering blue light mixed in the red light, such that the red light is emitted from the red filter structure and the blue light cannot be emitted from the red filter structure. Similarly, the green filter structure has the same function as that of the red filter structure. It is not difficult to understand that in the embodiment of the present disclosure, the first filter structure may be used for deflecting the light so as to improve the luminance of the front-viewing light emitted from the color film assembly, and for filtering the light so as to improve a display color gamut of the color film assembly.

Optionally, with further reference to FIG. 3, the color film assembly 112 further includes an organic layer 1123 positioned on a side of the filter layer distal from the quantum dot layer. The organic layer 1123 may have a refractive index smaller than that of the filter layer, in this way, the light may be conveniently refracted on the side of the converging structure S of the first filter structure 11211, such that the light emitted from the first filter structure 11211 converges towards the center of the light emitting surface of the first filter structure 11211. Exemplarily, the filter layer has a refractive index of 1.807 and the organic layer 1123 has a refractive index of 1.48533. It should be readily understood for those skilled in the art that the embodiment of the present disclosure will be described by way of examples of using one surface of the first filter structure 11211 distal from the quantum dot structure 11221 as a sawtooth surface and one surface of the first filter structure 11211 proximal to the quantum dot structure 11221 as a plane. When the surface of the optical structure 11211 proximal to the quantum dot structure 11221 is a sawtooth surface and the surface of the first filter structure 11211 distal from the quantum dot structure 11221 is a plane, the color film assembly 112 may not include the organic layer 1123, which is not limited by the embodiment of the present invention.

Optionally, with further reference to FIG. 3, the color film assembly 112 further includes a black matrix (BM) pattern 1124 located between the filter layer and the quantum dot layer. The black matrix pattern 1124 is of a mesh structure with an open region. The black matrix pattern 1124 is formed by vertically and horizontally intersecting black matrixes, and there is one black matrix between every two adjacent filter structures (including the first filter structure 11211 and the second filter structure 11212). In this way, light crosstalk between different filter structures may be avoided.

Optionally, in the embodiment of the present disclosure, the filter structure of each color may be made of a color resist material in a corresponding color. Exemplarily, the red filter structure may be made of a red color resist material. The green filter light structure may be made of a green color resist material. The blue filter structure may be made of a blue color resist material. The quantum dot structure of each color may be made of a quantum dot material in a corresponding color. Exemplarily, the red quantum dot structure may be made of a red quantum dot material. The green quantum dot structure may be made of a green quantum dot material. The organic layer 1123 may be made of an organic material such as a resin. The black matrix pattern 1124 may be made of a black resin material. The embodiment of the present disclosure sets no limitation thereto.

In summary, in the color film assembly according to the embodiment of the present disclosure, the light emitting surface of the first filter structure has the converging structure. The converging structure may deflect light incident into the converging structure through the quantum dot structure, such that the light emitted from the first filter structure converges towards the center of the light emitting surface of the first filter structure, the luminance of the front-viewing light emitted from the color film assembly through the quantum dot structure is increased, the difference between the luminance distribution of the light emitted from the color film assembly through the quantum dot structure and the luminance distribution of the light emitted from the color film assembly without passing through the quantum dot structure is reduced, the color shift of the color film assembly is favorably decreased, the color shift of the display apparatus is reduced, and the display effect of the display apparatus is improved.

Figure 8:
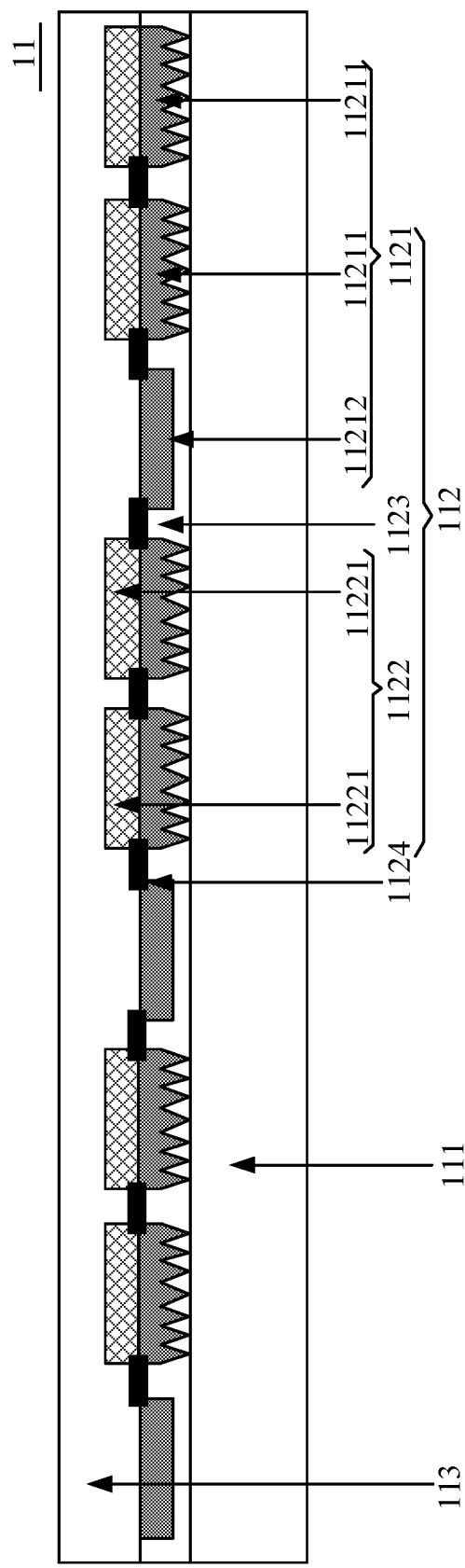
FIG. 8 is a schematic structural diagram of a display substrate according to an embodiment of the present disclosure.

Referring to FIG. 8, a schematic structural diagram of a display substrate 11 according to an embodiment of the present disclosure is illustrated. The display substrate 11 includes a base substrate 111 and a color film assembly 112 which is disposed on the base substrate 111. The color film assembly 112 includes a quantum dot layer (not shown in FIG. 8) and a filter layer (not shown in FIG. 8) positioned on a light emitting side of the quantum dot layer. The filter layer is positioned between the base substrate 111 and the quantum dot layer. For the structure of the color film assembly 112, reference is made to the embodiment shown in FIG. 3, detailed descriptions thereof are not given herein any further.

Optionally, as shown in FIG. 8, the display substrate 11 further includes a flat layer 113 positioned on a side of the quantum dot layer distal from the base substrate 111. The flat layer 113 may be used for flattening one side of the quantum dot layer distal from the base substrate 111 to ensure the flatness of the surface of the display substrate.

In the embodiment of the present disclosure, the base substrate 111 may be a transparent substrate, which may be a substrate made of a light-conducting and non-metallic material with a certain firmness such as glass, quartz or a transparent resin. The flat layer 113 may be made of an inorganic material such as $SiO_x$ (silicon oxide), $SiN_x$ (silicon nitride), $Al_2O_3$ (aluminum oxide) or $SiO_xN_x$ (silicon oxynitride). Certainly, the flat layer 113 may further be made of an organic material, which is not limited in the embodiment of the present disclosure.

It should be readily understood for those skilled in the art that the display substrate described in the embodiment of the present disclosure may be a color film substrate or a color filter on array (COA, integrating a color filter with an array substrate) substrate. The structure of the display panel described in the above embodiment is merely exemplary. In practical applications, the display substrate may further include more or less structures than the display substrate according to the embodiment of the present disclosure. For example, for the display substrate shown in FIG. 8, the display substrate may include no second filter structure 11212. For another example, when the display substrate is a color film substrate, the display substrate may further include a photo spacer (PS). When the display substrate is the COA substrate, the display substrate may further include a thin film transistor (TFT), an electrode, and the like, which is not described herein in the embodiment of the present disclosure.

In summary, in the display substrate according to the embodiment of the present disclosure, the light emitting surface of the first filter structure has the converging structure. The converging structure may deflect light incident into the converging structure through the quantum dot structure, such that the light emitted from the first filter structure converges towards the center of the light emitting surface of the first filter structure, the luminance of the front-viewing light emitted from the display substrate through the quantum dot structure is increased, the difference between the luminance distribution of the light emitted from the display substrate through the quantum dot structure and the luminance distribution of the light emitted from the display substrate without passing through the quantum dot structure is reduced, the color shift of the display substrate is favorably decreased, the color shift of the display apparatus is reduced, and the display effect of the display apparatus is improved.

A display substrate according to the embodiment of the present disclosure may be applied to the following method. A fabrication method and a fabrication principle of the display substrate in the embodiment of the present disclosure may refer to the description in the following embodiments.

Figure 9:
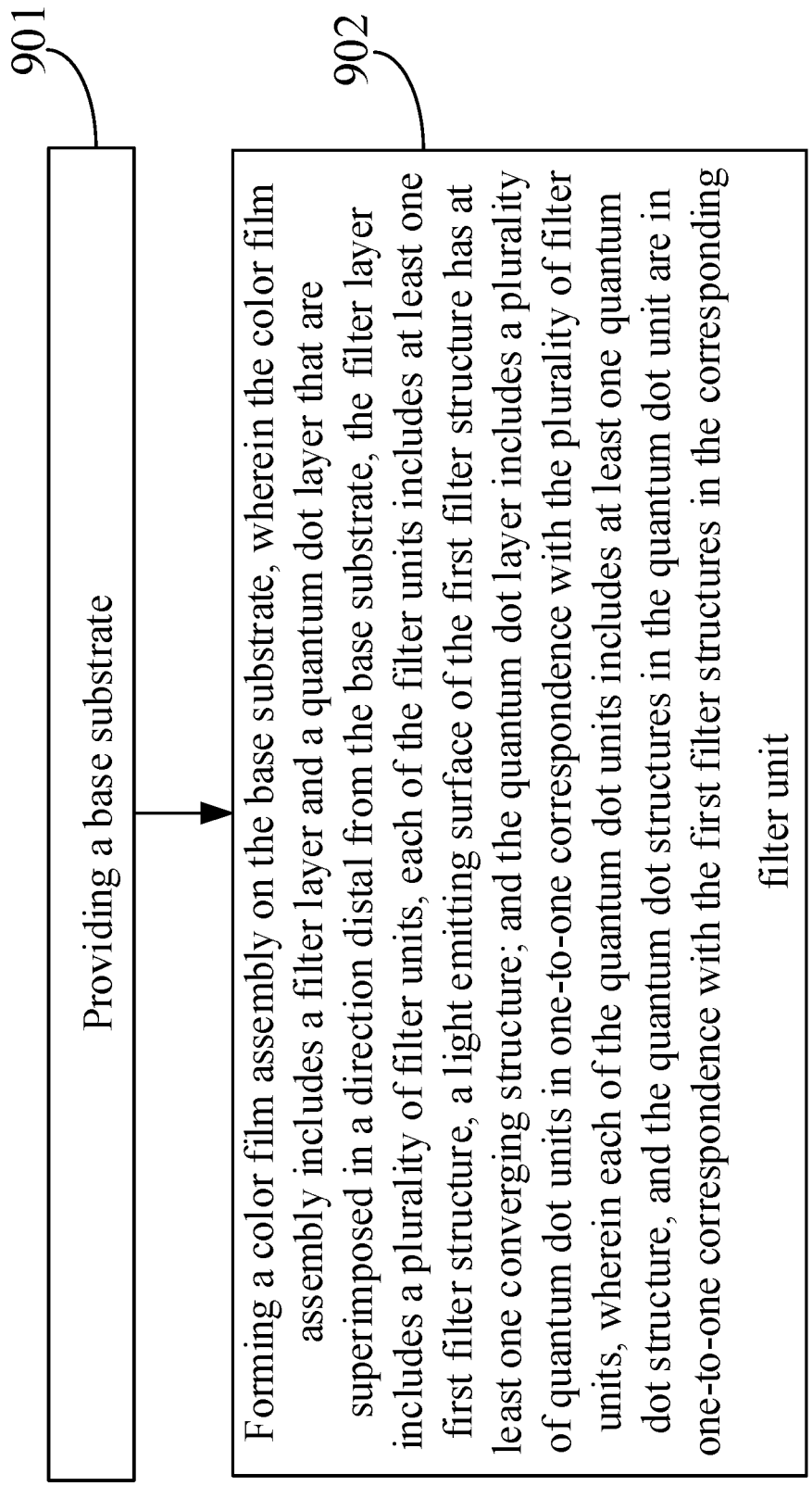
FIG. 9 is a flowchart of a method for fabricating a display substrate according to an embodiment of the present disclosure.

Reference is made to FIG. 9, which shows a flowchart of a method for fabricating a display substrate according to an embodiment of the present disclosure. With reference to FIG. 9, the method may include the following steps.

In step 901, a base substrate is provided.

In step 902, a color film assembly is formed on the base substrate, wherein the color film assembly includes a filter layer and a quantum dot layer that are superimposed in a direction distal from the base substrate, the filter layer includes a plurality of filter units, each of the filter units includes at least one first filter structure, a light emitting surface of the first filter structure has at least one converging structure; and the quantum dot layer includes a plurality of quantum dot units in one-to-one correspondence with the plurality of filter units, wherein each of the quantum dot units includes at least one quantum dot structure, and the quantum dot structures in the quantum dot unit are in one-to-one correspondence with the first filter structures in the corresponding filter unit.

The quantum dot structure is configured to emit colored light with a target color under the excitation of light incident into the quantum dot structure, wherein the target color is different from a color of the light incident into the quantum dot structure.

The first filter structure is configured to filter the light incident into the first filter structure.

The converging structure is configured to deflect the light incident into the converging structure, such that the light emitted from the first filter structure converges towards a center of the light emitting surface of the first filter structure.

In summary, according to the method for fabricating a display substrate according to the embodiment of the present invention, in the display panel fabricated by the method, the light emitting surface of the first filter structure has the converging structure. The converging structure may deflect light incident into the converging structure through the quantum dot structure, such that the light emitted from the first filter structure converges towards the center of the light emitting surface of the first filter structure, the luminance of the front-viewing light emitted from the display substrate through the quantum dot structure is increased, the difference between the luminance distribution of the light emitted from the display substrate through the quantum dot structure and the luminance distribution of the light emitted from the display substrate without passing through the quantum dot structure is reduced, the color shift of the display substrate is favorably decreased, the color shift of the display apparatus is reduced, and the display effect of the display apparatus is improved.

Optionally, the color film assembly further includes an organic layer. Step 902 includes the following sub-steps.

An organic layer is formed on the base substrate, wherein one surface of the organic layer distal from the base substrate has a plurality of first recess regions and a plurality of second recess regions, each of the first recess regions has at least one groove, and an included angle between a plane where at least one side of the groove is located and a surface of the base substrate is an acute angle.

A filter layer is formed on the base substrate where the organic layer is formed, wherein the filter layer includes a plurality of first filter structures and a plurality of second filter structures, the plurality of first filter structures are positioned in the plurality of first recess regions in a one-to-one correspondence fashion, a portion, positioned in the groove, of the first filter structure is a converging structure, the plurality of second filter structures are positioned in the plurality of second recess regions in a one-to-one correspondence fashion, and a light emitting surface and a light incident surface of the second filter structure are both planar.

A quantum dot layer is formed on the base substrate where the filter layer is formed.

Optionally, step 902 further includes:

a black matrix pattern is formed on the base substrate where the filter layer is formed.

Accordingly, that a quantum dot layer is formed on the base substrate where the filter layer is formed includes:

a quantum dot layer is formed on the base substrate where the black matrix pattern is formed.

The method further includes: a flat layer on the base substrate where the quantum dot layer is formed.

All of the above described optional technical solutions may be freely combined to form an optional embodiment of the present disclosure, and detailed description thereof is not given herein any further.

Figure 10:
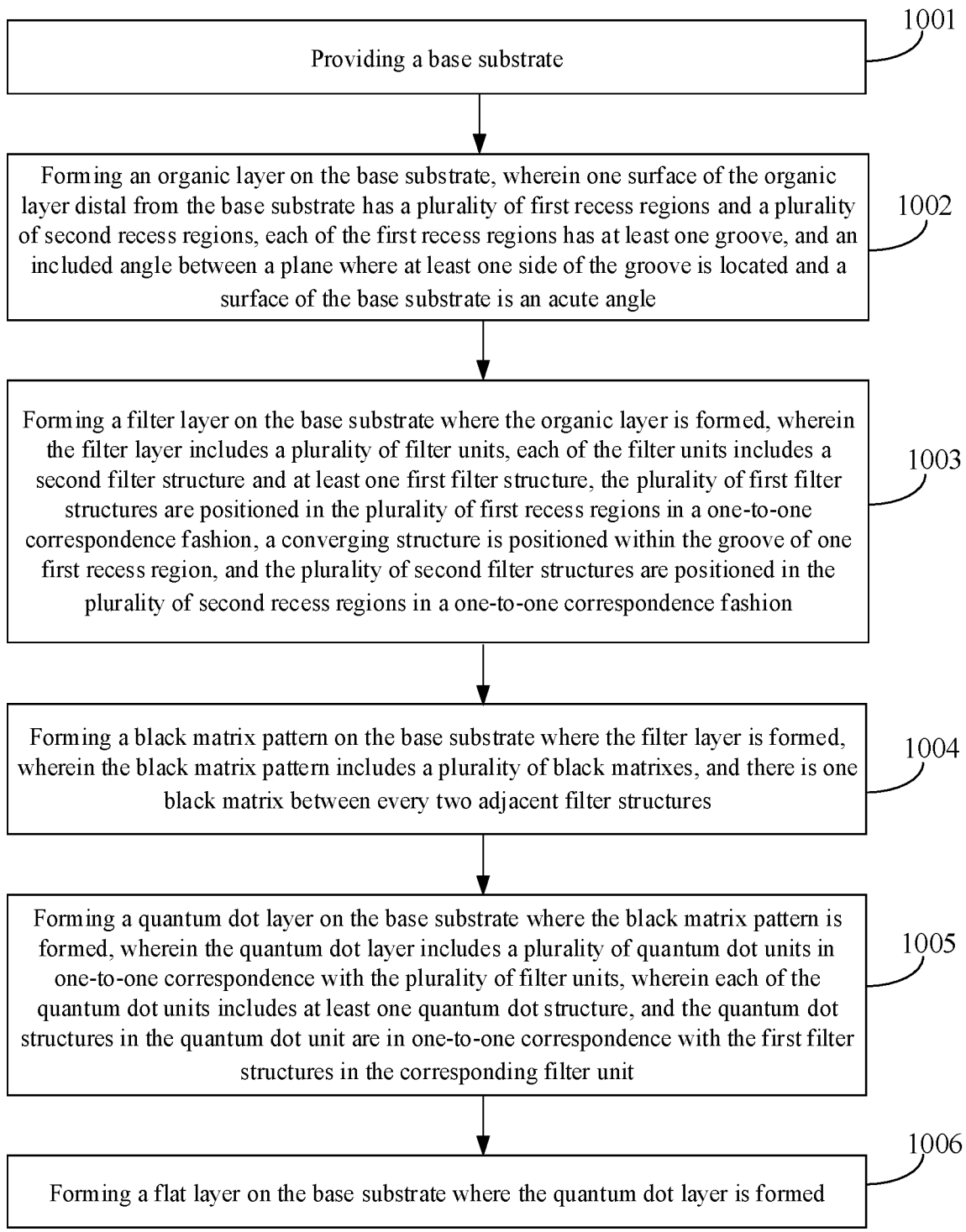
FIG. 10 is a flowchart of another method for fabricating a display substrate according to an embodiment of the present disclosure.

With reference to FIG. 10, a flowchart of another method for fabricating a display substrate according to an embodiment of the present disclosure is illustrated. This embodiment is described by way of an example of fabricating the display substrate 11 shown in FIG. 8. With reference to FIG. 10, the method includes the following steps.

In step 1001, a base substrate is provided.

The base substrate may be a transparent substrate, which may be a substrate made of a light-conducting and non-metallic material with a certain firmness such as glass, quartz or a transparent resin.

In step 1002, an organic layer is formed on the substrate, wherein one surface of the organic layer distal from the base substrate has a plurality of first recess regions and a plurality of second recess regions, each of the first recess regions has at least one groove, and an included angle between a plane where at least one side of the groove is located and a surface of the base substrate is an acute angle.

Figure 11:
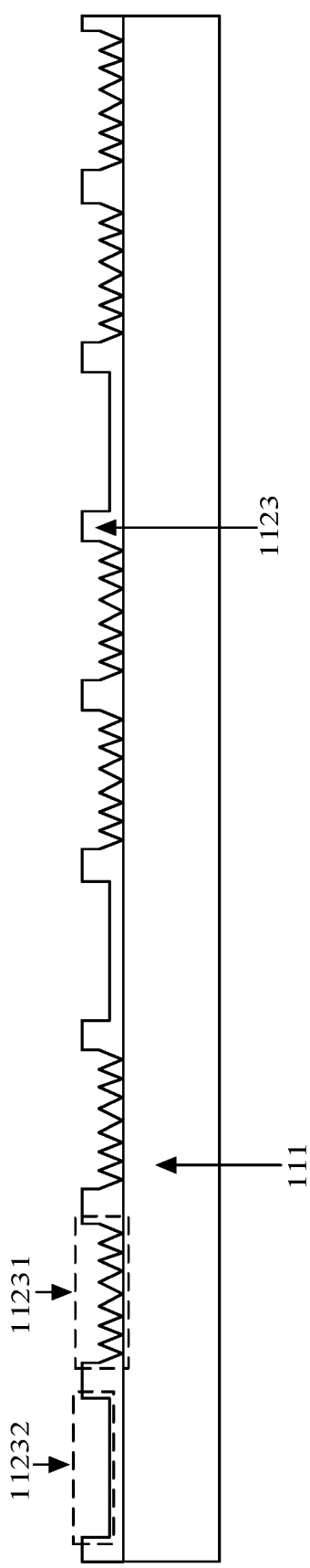
FIG. 11 is a schematic diagram after an organic layer is formed on a base substrate according to an embodiment of the present disclosure.

Referring to FIG. 11, a schematic diagram after an organic layer 1123 is formed on a substrate 111 according to an embodiment of the present disclosure is illustrated. With reference to FIG. 11, one surface of the organic layer 1123 distal from the substrate 111 has a plurality of first recess regions 11231 and a plurality of second recess regions 11232, each of the first recess regions 11231 has at least one groove (not shown in FIG. 11), and an included angle (not shown in FIG. 11) between the plane where at least one side of each groove is located and a surface (not shown in FIG. 11) of the base substrate 111 is an acute angle. The organic layer 1123 may be made of an organic material such as an organic resin.

Exemplarily, that an organic layer 1123 is formed on the base substrate 111 may include: an organic resin material layer is formed on the base substrate 111 by any one of processes such as coating, magnetron sputtering, thermal evaporation, or plasma enhanced chemical vapor deposition (PECVD), and the organic resin material layer is processed by one patterning process to obtain the organic layer 1123.

In step 1003, a filter layer is formed on the base substrate where the organic layer is formed, wherein the filter layer includes a plurality of filter units, each of the filter units includes a second filter structure and at least one first filter structure, the plurality of first filter structures are positioned in the plurality of first recess regions in a one-to-one correspondence fashion, a converging structure of each filter structure is positioned within the groove of one first recess region, and the plurality of second filter structures are positioned in the plurality of second recess regions in a one-to-one correspondence fashion.

Figure 12:
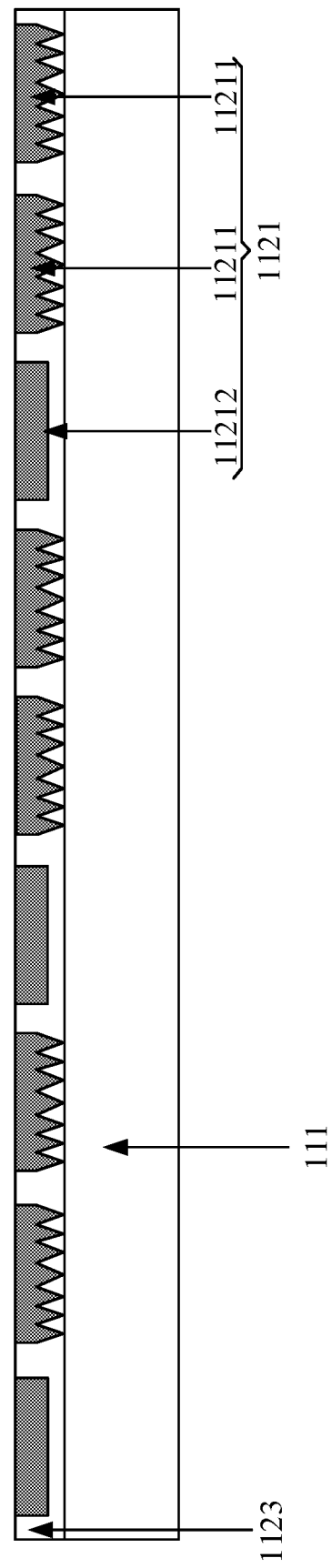
FIG. 12 is a schematic diagram after a filter layer is formed on a base substrate where an organic layer is formed according to an embodiment of the present disclosure.

Referring to FIG. 12, a schematic diagram after a filter layer is formed on a base substrate 111 where an organic layer 1123 is formed according to an embodiment of the present disclosure is illustrated. With reference to FIG. 12, the filter layer includes a plurality of filter units 1121, each filter unit 1121 includes a second filter structure 11212 and at least one first filter structure 11211, such that the filter layer includes a plurality of second filter structures 11212 and a plurality of first filter structures 11211. In conjunction with FIG. 11 and FIG. 12, the plurality of second filter structures 11212 are positioned in a plurality of second recess regions 11232 in a one-to-one correspondence fashion, and the plurality of first filter structures 11211 are positioned in a plurality of first recess regions 11231 in a one-to-one correspondence fashion. A converging structure (not shown in FIG. 12) of each first filter structure 11211 is positioned within the groove of one first recess region 12231, and a light emitting surface and a light incident surface of the second filter structure 11212 are both planar. As shown in FIG. 12, each filter unit 1121 includes two first filter structures 11211. In the embodiment of the present disclosure, the two first filter structures 11211 in each filter unit 1121 may include a red filter structure and a green filter structure, wherein the second filter structure 11212 may be a blue filter structure. The organic layer 1123 has a refractive index smaller than that of the filter layer. In other words, the organic layer 1123 has a refractive index smaller than that of any of the first filter structures 11211 and smaller than that of the second filter structure 11212.

Optionally, in the embodiment of the present disclosure, each of the red filter structure, the green filter structure and the blue filter structure may be made of a color resist material in a corresponding color, for example, the red filter structure is made of a red color resist material, the green filter structure is made of a green color resist material, and the blue filter structure is made of a blue color resist material. Exemplarily, that a filter layer is formed on the base substrate 111 where the organic layer 1123 is formed may include the following three steps.

In step (1), a red color resist layer is formed on the base substrate 111 where the organic layer 1123 is formed by any one of processes such as coating, magnetron sputtering, thermal evaporation, or PECVD, and the red color resist layer is processed by one patterning process to obtain the red filter structure.

In step (2), a green color resist layer is formed on the base substrate 111 where the red filter structure is formed by any one of processes such as coating, magnetron sputtering, thermal evaporation, or PECVD, and the green color resist layer is processed by one patterning process to obtain the green filter structure.

In step (3), a blue color resist layer is formed on the base substrate 111 where the green filter structure is formed by any one of processes such as coating, magnetron sputtering, thermal evaporation, or PECVD, and the blue color resist layer is processed by one patterning process to obtain the blue filter structure.

After the above steps (1) to (3), the red filter structure, the green filter structure and the blue filter structure may be formed on the base substrate 111 where the organic layer 1123 is formed, every adjacent red filter structure, green filter structure and blue filter structure form one filter unit, such that a plurality of filter units are obtained. The plurality of filter units form the filter layer.

It should be readily understood for those skilled in the art that the embodiment of the present disclosure is described by way of an example of sequentially forming the red filter structure, the green filter structure and the blue filter structure. In practical applications, the red filter structure, the green filter structure and the blue filter structure may be formed in any order. The embodiment of the present disclosure does not make limitations on a formation order of the red filter structure, the green filter structure and the blue filter structure.

In step 1004, a black matrix pattern is formed on the base substrate where the filter layer is formed, wherein the black matrix pattern includes a plurality of black matrices, and there is one black matrix between every two adjacent filter structures.

Figure 13:
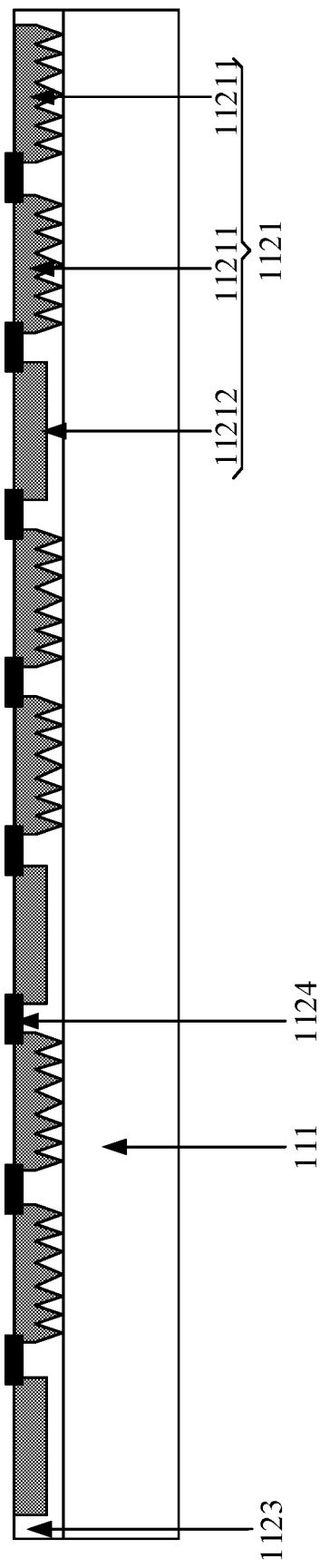
FIG. 13 is a schematic diagram after a black matrix pattern is formed on a base substrate where a filter layer is formed according to an embodiment of the present disclosure.

Referring to FIG. 13, a schematic diagram after a black matrix pattern 1124 is formed on a base substrate 111 where a filter layer is formed according to an embodiment of the present disclosure is illustrated. The black matrix pattern 1124 is of a mesh structure with an open region. The black matrix pattern 1124 is composed of black matrixes intersecting vertically and horizontally. With reference to FIG. 13, there is one black matrix between every two adjacent filter structures (including the first filter structure 11211 and the second filter structure 11212). The black matrix pattern 1124 may be made of a black resin material.

Exemplarily, that a black matrix pattern 1124 is formed on the base substrate 111 where the filter layer is formed may include: a black resin layer is formed on the base substrate 111 where the filter layer is formed by any one of processes such as coating, magnetron sputtering, thermal evaporation, or PECVD, and the black resin layer is processed by one patterning process to obtain the black matrix pattern 1124.

In step 1005, a quantum dot layer is formed on the base substrate where the black matrix pattern is formed, wherein the quantum dot layer includes a plurality of quantum dot units in one-to-one correspondence with the plurality of filter units, each quantum dot unit includes at least one quantum dot structure, and the quantum dot structures in each quantum dot unit are in one-to-one correspondence with the first filter structures in the corresponding filter unit.

Figure 14:
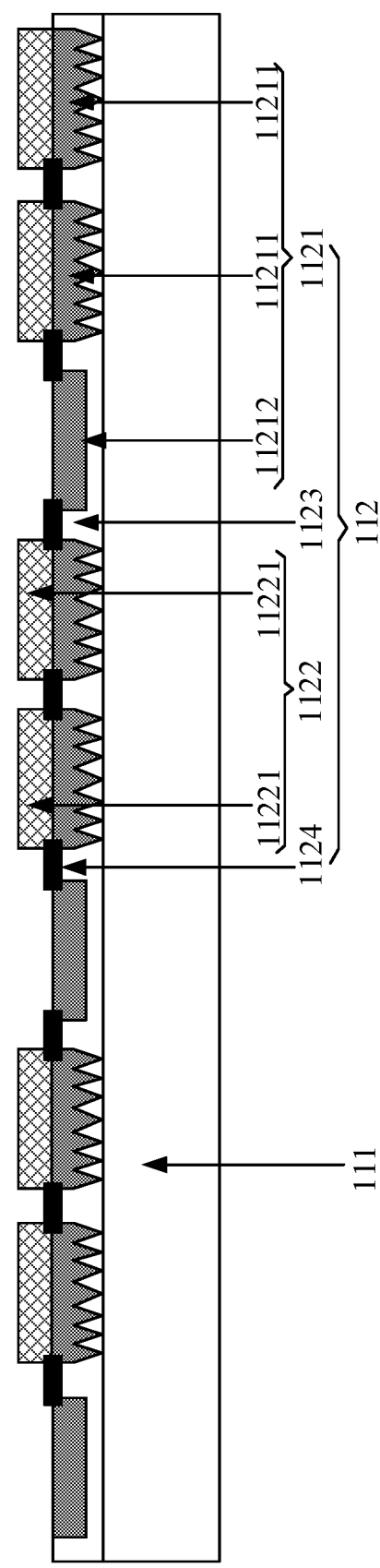
FIG. 14 is a schematic diagram after a quantum dot layer is formed on a base substrate where a black matrix pattern is formed according to an embodiment of the present disclosure.

Referring to FIG. 14, a schematic diagram after a quantum dot layer is formed on a substrate 111 where a black matrix pattern 1124 is formed according to an embodiment of the present disclosure is illustrated. With reference to FIG. 14, the quantum dot layer includes a plurality of quantum dot units 1122 in one-to-one correspondence with a plurality of filter units 1121, each quantum dot unit 1122 includes at least one quantum dot structure 11221, and the quantum dot structures 11221 in each quantum dot unit 1122 are in one-to-one correspondence with the first filter structures 11211 in the corresponding filter unit 1121. As shown in FIG. 14, each quantum dot unit 1122 includes two quantum dot structures 11221. The two quantum dot structures 11221 in each quantum dot unit 1122 are in one-to-one correspondence with the two first filter structures 11211 in the corresponding filter unit 1121. The two quantum dot structures 11221 in each quantum dot unit 1122 may include a red quantum dot structure and a green quantum dot structure, wherein the red quantum dot structure corresponds to the red filter structure, and the green quantum dot structure corresponds to the green filter structure. An orthographic projection of each quantum dot structure 11221 on a plane where a light incident surface of the quantum dot structure 11221 is located at least partially overlaps with an orthographic projection of the corresponding first filter structure 11211 on a plane where the light incident surface of the quantum dot structure 11221 is located. Optionally, an orthographic projection of each quantum dot structure 11221 on a plane where the light incident surface of the quantum dot structure 11221 is located coincides with an orthographic projection of the corresponding first filter structure 11211 on the plane where the light incident surface of the quantum dot structure 11221 is located.

Optionally, in the embodiment of the present disclosure, each of the red quantum dot structure and the green quantum dot structure may be made of a quantum dot material in a corresponding color, for example, the red quantum dot structure is made of a red quantum dot material, and the green quantum dot structure is made of a green quantum dot material. Exemplarily, that a quantum dot layer is formed on the base substrate 111 where the black matrix pattern 1124 is formed may include the following two steps.

In step (1), a red quantum dot material layer is formed on the base substrate 111 where the black matrix pattern 1124 is formed by any one of processes such as coating, magnetron sputtering, thermal evaporation, or PECVD, and the red quantum dot material layer is processed by one patterning process to obtain a red quantum dot structure.

In step (2), a green quantum dot material layer is formed on the base substrate 111 where the red quantum dot structure is formed by any of processes such as coating, magnetron sputtering, thermal evaporation, or PECVD, and the green quantum dot material layer is processed by one patterning process to obtain a green quantum dot structure.

After the above steps (1) to (2), the red quantum dot structure and the green quantum dot structure may be formed on the base substrate 111 where the black matrix pattern 1124 is formed, every adjacent red quantum dot structure and green quantum dot structure form one quantum dot unit, such that a plurality of quantum dot units are obtained. The plurality of quantum dot units form a quantum dot layer. The quantum dot layer, the black matrix 1124, the filter layer and the organic layer 1123 form a color film assembly 112.

It should be readily understood for those skilled in the art that the embodiment of the present disclosure is described by way of an example of sequentially forming the red quantum dot structure and the green quantum dot structure. In practical applications, the red quantum dot structure and the green quantum dot structure may be formed in any order. The embodiment of the present disclosure does not make limitations on a formation order of the red quantum dot structure and the green quantum dot structure.

In step 1006, a flat layer is formed on the base substrate where the quantum dot layer is formed.

A schematic diagram after a flat layer 113 is formed on a base substrate 111 where a quantum dot layer is formed may refer to FIG. 8. The flat layer 113 may be made of an organic resin.

Exemplarily, an organic resin layer may be deposited as the flat layer 113 on the base substrate 111 where the quantum dot layer is formed by any of processes such as coating, magnetron sputtering, thermal evaporation, or PECVD.

In the method for fabricating a display substrate according to the embodiment of the present disclosure, one patterning process involved includes photoresist coating, exposure, development, etching, and photoresist stripping. That the material layer (for example, the red color resist layer) is processed by one patterning process includes: a photoresist layer is formed on the material layer (for example, the red color resist layer), and then the photoresist layer is exposed with a mask, such that the photoresist layer forms a fully-exposed region and a non-exposed region. Then, the photoresist layer is processed by a development process such that a photoresist in the fully-exposed area is completely removed, and a photoresist in the non-exposed area is completely retained. Then, a region corresponding to the fully-exposed region on the material layer is etched by employing an etching process. Finally, the photoresist in the non-exposed area is stripped to obtain a corresponding structure (for example, the red filter structure). Herein, one patterning process is described by using a positive photoresist as an example. When the photoresist is a negative photoresist, the process of one patterning process may refer to the description of this paragraph, and a detailed description thereof may be omitted in the embodiment of the present disclosure.

It should be readily understood for those skilled in the art that the sequence of steps of the method for fabricating a display substrate according to the embodiment of the present disclosure may be appropriately adjusted, and the steps may be correspondingly increased or decreased as appropriate. Methods variations of which may be easily conceived by those skilled in the art within the technical scope disclosed in the present disclosure should fall within the scope of protection of the present disclosure and therefore will be omitted.

In summary, according to the method for fabricating a display substrate according to the embodiment of the present disclosure, in the display substrate fabricated by the method, one surface of the first filter structure proximal to the base substrate has the converging structure. The converging structure may deflect light incident into the converging structure through the quantum dot structure, such that the light emitted from the first filter structure converges towards the center of the light emitting surface of the first filter structure, the luminance of the front-viewing light emitted from the display substrate through the quantum dot structure is increased, the difference between the luminance distribution of the light emitted from the display substrate through the quantum dot structure and the luminance distribution of the light emitted from the display substrate without passing through the quantum dot structure is reduced, the color shift of the display substrate is favorably decreased, the color shift of the display apparatus is reduced, and the display effect of the display apparatus is improved.

Figure 15:
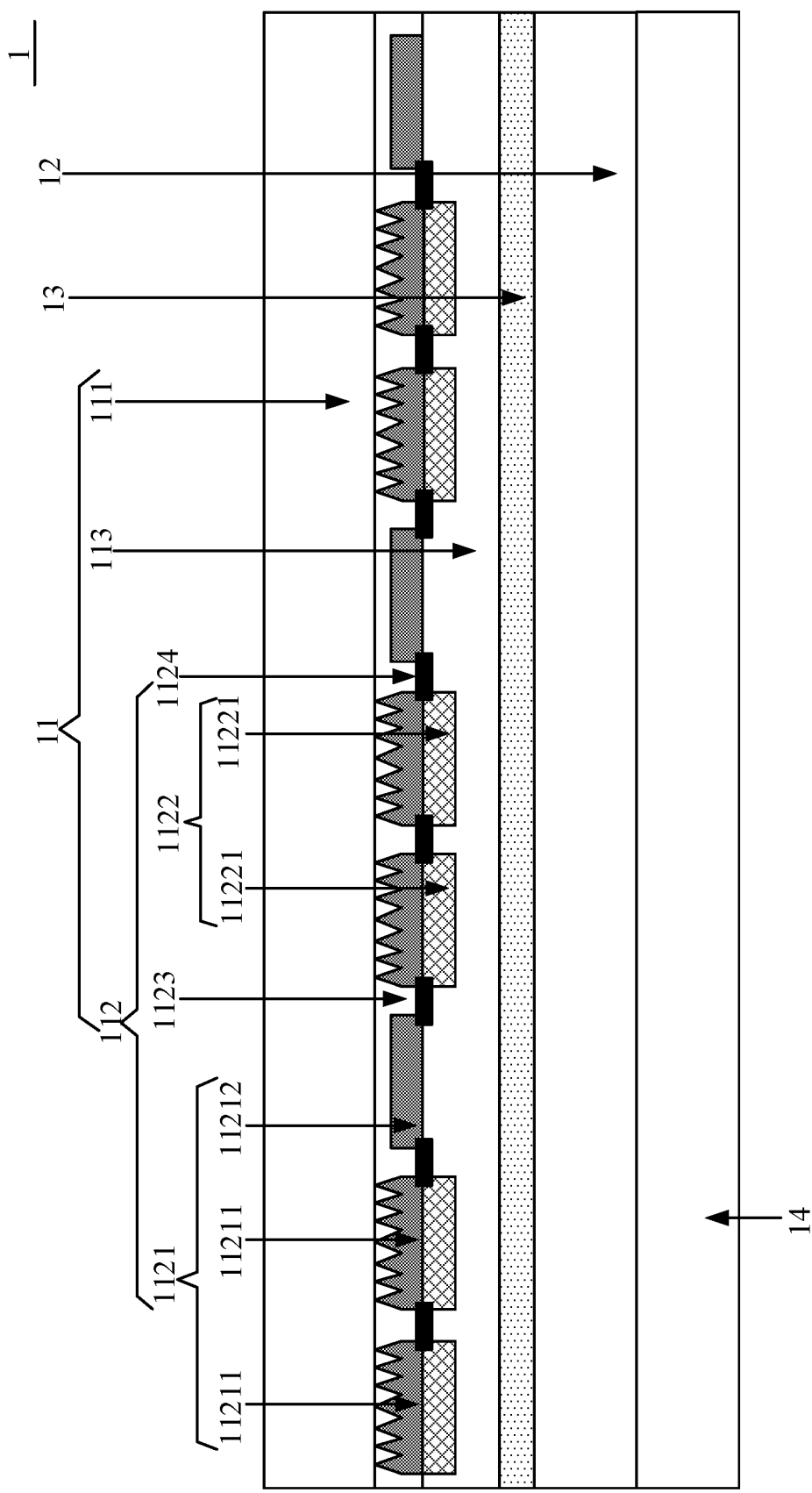
FIG. 15 is a schematic diagram showing a structure of a display apparatus according to an embodiment of the present disclosure.

Referring to FIG. 15, a schematic structural diagram of a display apparatus 1 according to an embodiment of the present disclosure is illustrated. The display apparatus 1 includes a display substrate 11 shown in FIG. 8. The structure of the display substrate 11 may refer to FIG. 8, and a detailed description thereof may be omitted in the embodiment of the present disclosure.

Optionally, the display substrate 11 may be a color film substrate or a COA substrate. When the display substrate 11 is a color film substrate, as shown in FIG. 15, the display apparatus 1 further includes an array substrate 12 opposite to the display substrate 11, and a liquid crystal layer 13 positioned between the array substrate 12 and the display substrate 11. The array substrate 12 generally includes a base substrate, as well as a TFT, a common electrode, and a pixel electrode which are positioned on the base substrate. The structure of the array substrate 12 may refer to the related art, and a detailed description thereof may be omitted here in the embodiment of the present disclosure.

Optionally, as shown in FIG. 15, the display apparatus 1 further includes a backlight module 14 positioned on a side of the array substrate 12 distal from the display substrate 11, and the backlight module 14 is a blue backlight module. The backlight module 14 may be a direct type backlight module or a side type backlight module. The backlight module 14 may include a light-conducting plate, a backlight, an optical film, a reflector plate and a rubber frame. For the structure of the backlight module 14, reference may be made to the related art, and a detailed description thereof may be omitted here in the embodiment of the present disclosure.

Figure 16:
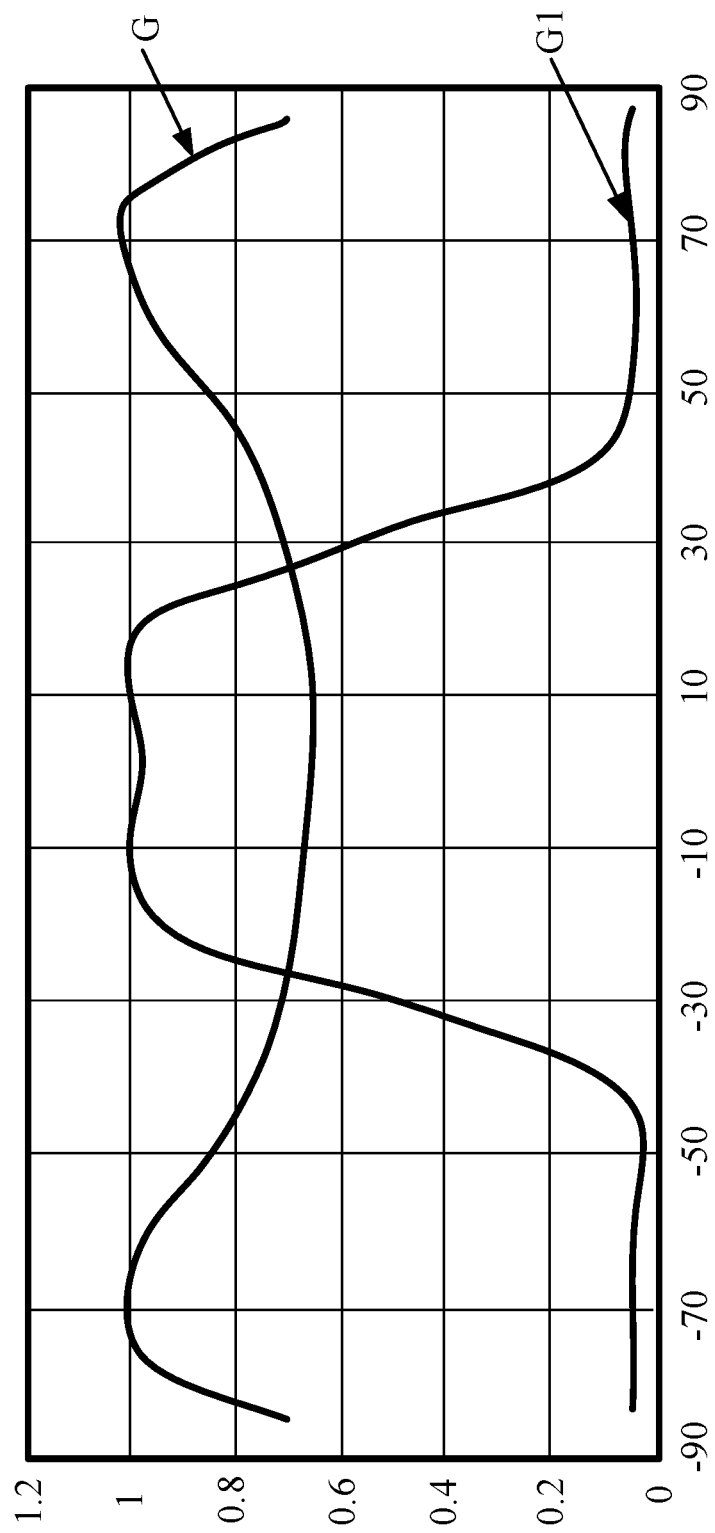
FIG. 16 is a diagram of comparison between luminance distribution of light emitted from a display apparatus shown in FIG. 1 and luminance distribution of light emitted from a display apparatus shown in FIG. 15.

In the embodiment of the present disclosure, the display apparatus 1 includes a display substrate. The light emitting surface of the first filter structure of the display substrate has the converging structure. The converging structure may deflect light incident into the converging structure through the quantum dot structure, such that the light emitted from the first filter structure converges towards the center of the light emitting surface of the first filter structure, the luminance of the front-viewing light emitted from the display substrate through the quantum dot structure is increased, and the luminance of the front-viewing light emitted from the display apparatus through the quantum dot structure is increased. Exemplarily, FIG. 16 is a diagram pf comparison of a luminance distribution of light emitted from a display apparatus shown in FIG. 1 and luminance distribution of light emitted from a display apparatus shown in FIG. 15, wherein a horizontal ordinate represents an included angle between the light emitted from the display apparatus and a plane perpendicular to the light emitting surface of the display apparatus, a vertical coordinate represents luminance of the light emitted from the display apparatus, a curve G represents a luminance curve of the light emitted from the display apparatus 0 shown in FIG. 1 sequentially through the quantum dot structure and the filter structure, and a curve G1 represents a luminance curve of the light emitted from the display apparatus 1 shown in FIG. 15 sequentially through the quantum dot structure and the filter structure. As seen from FIG. 16, in the light emitted from the display apparatus 1 shown in FIG. 15 sequentially through the quantum dot structure and the filter structure, the luminance of the front-viewing light is greater than that of the side-viewing light. Therefore, the display apparatus shown in FIG. 15 may increase the luminance of the front-viewing light emitted from the display substrate through the quantum dot structure. In addition, it may be seen from the comparison between the curve G1 in FIG. 16 and the curve H (the luminance curve of the light emitted from the display apparatus through the filter structure and without passing through the quantum dot structure) in FIG. 2 that a difference between a trend of the curve G1 and a trend of the curve H is small. Therefore, in the display apparatus 1 according to the embodiment of the present disclosure, a difference between the luminance distribution of the light emitted from the display apparatus 1 sequentially through the quantum dot structure and the filter structure and the luminance distribution of the light emitted from the display apparatus 1 through the filter structure and without passing through the quantum dot structure is small, and therefore, the color shift of the display apparatus 1 is relatively small.

In summary, the display apparatus according to the embodiment of the present disclosure includes a display substrate. In the display substrate, the light emitting surface of the first filter structure has the converging structure. The converging structure may deflect light incident into the converging structure through the quantum dot structure, such that the light emitted from the first filter structure converges towards the center of the light emitting surface of the first filter structure, the luminance of the front-viewing light emitted from the display substrate through the quantum dot structure is increased, the difference between the luminance distribution of the light emitted from the display substrate through the quantum dot structure and the luminance distribution of the light emitted from the display substrate without passing through the quantum dot structure is reduced, the color shift of the display apparatus is favorably decreased, and the display effect of the display apparatus is improved.

Other embodiments of the present disclosure can be available to those skilled in the art upon consideration of the specification and practice of the invention disclosed herein. The present disclosure is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

It is to be understood that this disclosure is not limited to the precise constructions described above and shown in the accompanying drawings, and various modifications and variations may be made without departing from the scope of the present disclosure. The scope of the present disclosure is only subject to the appended claims.

What is claimed is:

1. A color film assembly, comprising:
a quantum dot layer, and a filter layer on a light emitting side of the quantum dot layer: wherein the filter layer comprises a plurality of filter units, each of the filter units comprising at least one first filter structure, a light emitting surface of the first filter structure having at least one converging structure; and the quantum dot layer comprises a plurality of quantum dot units in one-to-one correspondence with the plurality of filter units, each of the quantum dot units comprising at least one quantum dot structure, the quantum dot structures in the quantum dot unit being in one-to-one correspondence with the first filter structures in the corresponding filter unit;
wherein the converging structure is configured to deflect light incident into the converging structure, such that light emitted from the first filter structure converges towards a center of the light emitting surface of the first filter structure.

2. The color film assembly according to claim 1, wherein the converging structure is a convex structure, and an included angle between a plane where at least one side of the converging structure is located and a plane wherein a light incident surface of the first filter structure is located is an acute angle.

3. The color film assembly according to claim 2, wherein a cross section of the converging structure in a direction perpendicular to the plane where the light incident surface of the first filter structure is located is triangular or trapezoidal.

4. The color film assembly according to claim 3, wherein the first filter structure is a sawtooth structure, and the light emitting surface of the first filter structure is a sawtooth surface.

5. The color film assembly according to claim 1, wherein an orthographic projection of the quantum dot structure on a plane where a light incident surface of the quantum dot structure is located coincides with an orthographic projection of the corresponding first filter structure on the plane where the light incident surface of the quantum point structure is located.

6. The color film assembly according to claim 5, wherein the filter unit comprises two first filter structures, and the quantum dot unit comprises two quantum dot structures, colors of light emitted from the two quantum dot structures in the quantum dot unit being different.

7. The color film assembly according to claim 6, wherein the filter unit further comprises a second filter structure, a light emitting surface and a light incident surface of the second filter structure being both planar.

8. The color film assembly according to claim 7, wherein the two first filter structures comprise a red filter structure and a green filter structure, the second filter structure is a blue filter structure, and the two quantum dot structures comprise a red quantum dot structure corresponding to the red filter structure and a green quantum dot structure corresponding to the green filter structure.

9. The color film assembly according to claim 1, further comprising:
an organic layer on a side of the filter layer distal from the quantum dot layer, wherein the organic layer has a refractive index less than that of the filter layer.

10. The color film assembly according to claim 1, further comprising:
a black matrix pattern between the filter layer and the quantum dot layer.

11. The color film assembly according to claim 1, wherein the filter unit comprises two first filter structures, the two first filter structures comprising a red filter structure and a green filter structure, and the filter unit further comprises a blue filter structure, a light emitting surface and a light incident surface of the blue filter structure being both planar;
the quantum dot unit comprises two quantum dot structures, the two quantum dot structures comprising a red quantum dot structure corresponding to the red filter structure, and a green quantum dot structure corresponding to the green filter structure, wherein an orthographic projection of the quantum dot structure on the plane where a light incident surface of the quantum dot structure is located coincides with an orthographic projection of the corresponding first filter structure on the plane where the light incident surface of the quantum dot structure is located;

wherein the first filter structure is a sawtooth structure, the light emitting surface of the first filter structure is a sawtooth surface, the converging structure is a convex structure, an included angle between a plane where at least one side of the converging structure is located and a plane where the light incident surface of the first filter structure is located is an acute angle, and a cross section of the converging structure in a direction perpendicular to the plane where the light incident surface of the first filter structure is located is triangular or trapezoidal;

the color film assembly further comprises an organic layer on a side of the filter layer distal from the quantum dot layer, wherein the organic layer has a refractive index less than that of the filter layer; and a black matrix pattern between the filter layer and the quantum dot layer.

12. A display substrate, comprising a base substrate, and a color film assembly on the base substrate, wherein the color film assembly comprises:

a quantum dot layer, and a filter layer on a light emitting side of the quantum dot layer; wherein the filter layer comprises a plurality of filter units, each of the filter units comprising at least one first filter structure, a light emitting surface of the first filter structure having at least one converging structure; and the quantum dot layer comprises a plurality of quantum dot units in one-to-one correspondence with the plurality of filter units, each of the quantum dot units comprising at least one quantum dot structure, the quantum dot structures in the quantum dot unit being in one-to-one correspondence with the first filter structures in the corresponding filter unit;

wherein the converging structure is configured to deflect light incident into the converging structure, such that light emitted from the first filter structure converges towards a center of the light emitting surface of the first filter structure.

13. The display substrate according to claim 12, wherein the converging structure is a convex structure, and an included angle between the plane where at least one side of the converging structure is located and the plane where the light incident surface of the first filter structure is located is an acute angle.

14. The display substrate according to claim 12, wherein the filter unit comprises two first filter structures, and the quantum dot unit comprises two quantum dot structures, colors of light emitted from the two quantum dot structures in the quantum dot unit being different; and the filter unit further comprises a second filter structure, wherein a light emitting surface and a light incident surface of the second filter structure are both planar.

15. The display substrate according to claim 12, wherein the color film assembly further comprises:

an organic layer on a side of the filter layer distal from the quantum dot layer, wherein the organic layer has a refractive index less than that of the filter layer; and a black matrix pattern between the color filter layer and the quantum dot layer; and the display substrate further comprises a flat layer on a side of the quantum dot layer distal from the base substrate.

16. A display apparatus, comprising the display substrate as defined in claim 12.

17. The display apparatus to claim 16, wherein the display substrate is a color film substrate, and the display apparatus further comprises:

an array substrate, opposite to the display substrate;

a liquid crystal layer between the array substrate and the display substrate; and a blue backlight module on a side of the array substrate distal from the display substrate.

18. A method for fabricating a display substrate, comprising:

providing a base substrate;

forming a color film assembly on the base substrate; wherein the color film assembly comprises a filter layer and a quantum dot layer that are superimposed in a direction distal from the base substrate, the filter layer comprising a plurality of filter units, each of the filter units comprising at least one first filter structure, a light emitting surface of the first filter structure having at least one converging structure; and the quantum dot layer comprises a plurality of quantum dot units in one-to-one correspondence with the plurality of filter units, each of the quantum dot units comprising at least one quantum dot structure, the quantum dot structures in the quantum dot unit being in one-to-one correspondence with the first filter structures in the corresponding filter unit;

wherein the converging structure is configured to deflect light incident into the converging structure, such that light emitted from the first filter structure converges towards a center of the light emitting surface of the first filter structure.

19. The method according to claim 18, wherein the color film assembly further comprises an organic layer; and the forming a color film assembly on the base substrate comprises:

forming the organic layer on the base substrate, wherein one surface of the organic layer distal from the base substrate has a plurality of first recess regions and a plurality of second recess regions, each of the first recess regions having at least one groove, an included angle between a plane where at least one side of the groove is located and a surface of the base substrate being an acute angle;

forming the filter layer on the base substrate where the organic layer is formed, wherein the filter layer comprises a plurality of the first filter structures and a plurality of second filter structures, the plurality of first filter structures being in the plurality of first recess regions in a one-to-one correspondence fashion, a portion, in the groove, of the first filter structure being the converging structure, the plurality of second filter structures being in the plurality of second recess regions in a one-to-one correspondence fashion, a light emitting surface and a light incident surface of the second filter structure being both planar; and forming the quantum dot layer on the base substrate where the filter layer is formed.

20. The method according to claim 19, wherein the forming a color film assembly on the base substrate further comprises:

forming a black matrix pattern on the base substrate where the filter layer is formed;

the forming the quantum dot layer on the base substrate where the filter layer is formed comprises:

forming the quantum dot layer on the base substrate where the black matrix pattern is formed; and the method further comprises: forming a flat layer on the base substrate where the quantum dot layer is formed.

* * * * *